US009892814B2

(12) United States Patent
Maula

(10) Patent No.: US 9,892,814 B2
(45) Date of Patent: Feb. 13, 2018

(54) METHOD FOR FORMING AN ELECTRICALLY CONDUCTIVE OXIDE FILM, AN ELECTRICALLY CONDUCTIVE OXIDE FILM, AND USES FOR THE SAME

(71) Applicant: Beneq Oy, Vantaa (FI)

(72) Inventor: Jarmo Maula, Espoo (FI)

(73) Assignee: Beneq Oy, Vantaa (FI)

( * ) Notice: Subject to any disclaimer, the term of this patent is extended or adjusted under 35 U.S.C. 154(b) by 66 days.

(21) Appl. No.: 15/040,177

(22) Filed: Feb. 10, 2016

(65) Prior Publication Data

US 2016/0172070 A1 Jun. 16, 2016

Related U.S. Application Data

(62) Division of application No. 13/505,640, filed as application No. PCT/FI2010/050874 on Nov. 2, 2010, now Pat. No. 9,290,840.

(30) Foreign Application Priority Data

Nov. 6, 2009 (FI) ...................................... 20096154

(51) Int. Cl.
*H01L 21/31* (2006.01)
*H01B 1/08* (2006.01)
(Continued)

(52) U.S. Cl.
CPC ............... *H01B 1/08* (2013.01); *C23C 16/08* (2013.01); *C23C 16/18* (2013.01); *C23C 16/40* (2013.01);
(Continued)

(58) Field of Classification Search
CPC .. H01L 21/336; B32B 15/04; C23C 16/45529
(Continued)

(56) References Cited

U.S. PATENT DOCUMENTS 4,389,973 A 6/1983 Suntola et al.
4,413,022 A 11/1983 Suntola et al.
(Continued)

FOREIGN PATENT DOCUMENTS

CN 101389439 A 3/2009
EP 1 229 356 A2 8/2002
EP 1 674 890 A2 6/2006

OTHER PUBLICATIONS

Finnish Office Action for corresponding Finnish Patent Application No. 20096154 dated Aug. 18, 2010.
(Continued)

*Primary Examiner* — Khanh Tuan Nguyen
(74) *Attorney, Agent, or Firm* — Merchant & Gould P.C.

(57) ABSTRACT

A method for forming an electrically conductive oxide film (1) on a substrate (2), the method comprising the steps of, bringing the substrate (2) into a reaction space, forming a preliminary deposit on a deposition surface of the substrate (2) and treating the deposition surface with a chemical. The step of forming the preliminary deposit on the deposition surface of the substrate (2) comprises forming a preliminary deposit of transition metal oxide on the deposition surface and subsequently purging the reaction space. The step of treating the deposition surface with a chemical comprises treating the deposition surface with an organometallic chemical and subsequently purging the reaction space, to form oxide comprising oxygen, first metal and transition metal. The steps of forming the preliminary deposit and treating the deposition surface being alternately repeated such that a film (1) of electrically conductive oxide is formed on the substrate (2).

8 Claims, 5 Drawing Sheets

Figure 1:
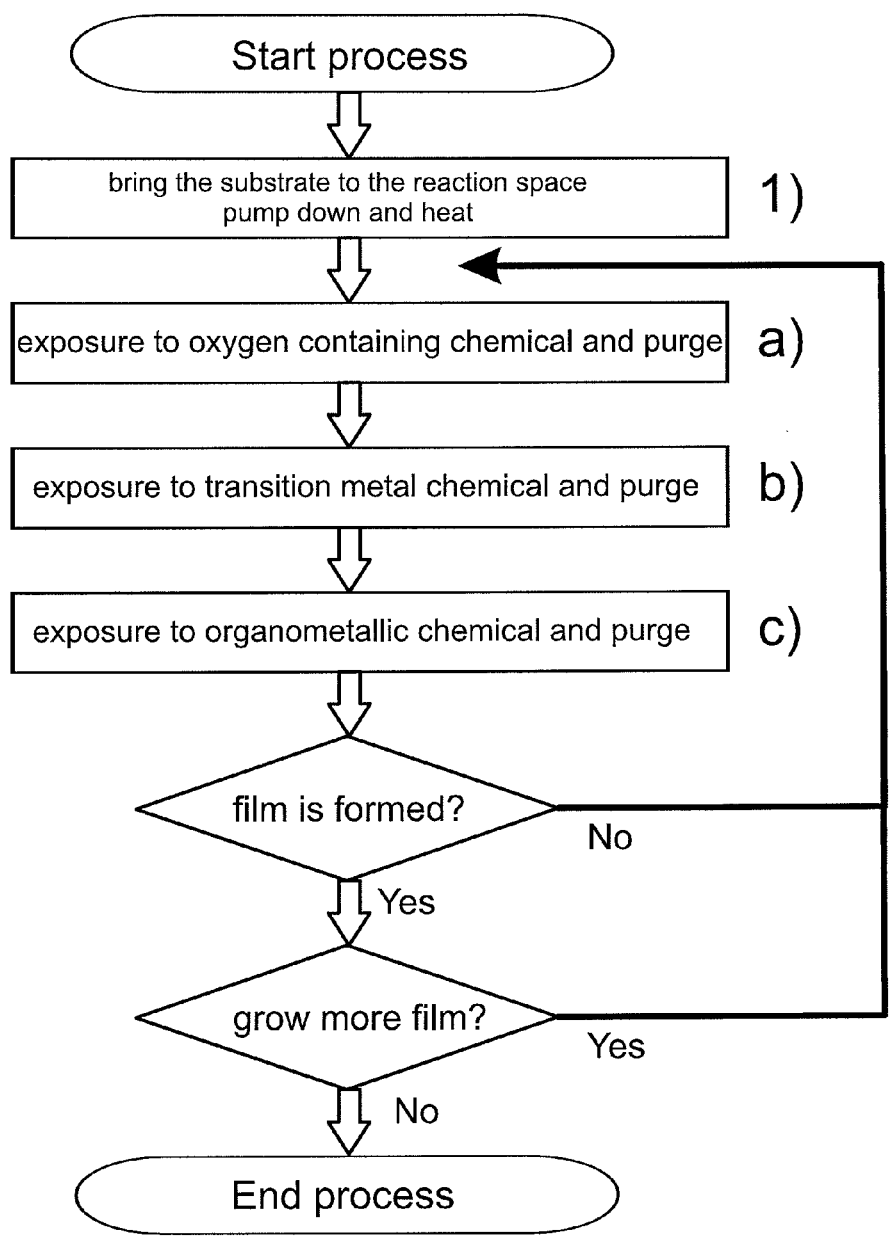

(51) Int. Cl.
| | |
|---|---|
| C23C 16/08 | (2006.01) |
| C23C 16/18 | (2006.01) |
| C23C 16/40 | (2006.01) |
| C23C 16/44 | (2006.01) |
| C23C 16/455 | (2006.01) |
| C23C 28/00 | (2006.01) |
| C23C 30/00 | (2006.01) |
| C23C 28/04 | (2006.01) |

(52) U.S. Cl.
   CPC .......... *C23C 16/403* (2013.01); *C23C 16/405* (2013.01); *C23C 16/4408* (2013.01); *C23C 16/45523* (2013.01); *C23C 16/45525* (2013.01); *C23C 16/45531* (2013.01); *C23C 28/00* (2013.01); *C23C 28/04* (2013.01); *C23C 30/00* (2013.01)

(58) Field of Classification Search
   USPC .................. 252/518.1; 257/410; 438/763
   See application file for complete search history.

(56) References Cited

U.S. PATENT DOCUMENTS

| | | | |
|---|---|---|---|
| 4,486,487 | A | 12/1984 | Skarp |
| 6,174,377 | B1 | 1/2001 | Doering et al. |
| 6,824,816 | B2 | 11/2004 | Aaltonen et al. |
| 7,147,794 | B2 | 12/2006 | Gasloli |
| 7,270,895 | B2 | 9/2007 | Anton |
| 2003/0040196 | A1 | 2/2003 | Lim et al. |
| 2003/0207529 | A1 | 11/2003 | Lim et al. |
| 2004/0208994 | A1 | 10/2004 | Harkonen et al. |
| 2004/0214399 | A1 | 10/2004 | Ahn et al. |
| 2004/0238872 | A1 | 12/2004 | Lee et al. |
| 2005/0110069 | A1 | 5/2005 | Kil et al. |
| 2006/0043504 | A1 | 3/2006 | Ahn et al. |
| 2006/0157694 | A1 | 7/2006 | Lee et al. |
| 2006/0251875 | A1 | 11/2006 | Carlisle et al. |
| 2007/0252244 | A1 | 11/2007 | Srividya et al. |
| 2009/0035946 | A1* | 2/2009 | Pierreux ........... C23C 16/45529 438/763 |

OTHER PUBLICATIONS

International Preliminary Report on Patentability for corresponding International Patent Application No. PCT/FI2010/050874 dated Mar. 12, 2012.

International Search Report for corresponding International Patent Application No. PCT/FI2010/050874 dated Feb. 25, 2011.

Taiwanese Office Action for corresponding Taiwanese Patent Application No. 099137883 dated Dec. 15, 2014 (English translation).

* cited by examiner

METHOD FOR FORMING AN ELECTRICALLY CONDUCTIVE OXIDE FILM, AN ELECTRICALLY CONDUCTIVE OXIDE FILM, AND USES FOR THE SAME

This application is a Divisional of U.S. Ser. No. 13/505,640, filed 2 May 2012, which is a National Stage Application of PCT/FI2010/050874, filed 2 Nov. 2010, which claims benefit of Serial No. 20096154, filed 6 Nov. 2009 in Finland and which applications are incorporated herein by reference. To the extent appropriate, a claim of priority is made to each of the above disclosed applications.

FIELD OF THE INVENTION

The present invention relates to film deposition technology. Especially the present invention relates to a method for forming an electrically conductive, light absorbing oxide film by forming a deposit on a deposition surface and treating this deposit with a chemical, and to electrically conductive, light absorbing oxide films fabricated using such a method.

BACKGROUND OF THE INVENTION

Atomic Layer Deposition (ALD) is a well known method for depositing conformal thin-films with relatively uniform thickness profile over substrates of various shapes, even over complex 3D (three dimensional) structures. In ALD the coating is grown by alternately repeating, essentially self-limiting, surface reactions between a precursor and a surface to be coated. Therefore the growth mechanism in an ALD process enables coating essentially without directional effects.

In an ALD process two or more different chemicals (precursors) are introduced to a reaction space in a sequential, alternating, manner and the chemicals adsorb on surfaces, e.g. on a substrate, inside the reaction space. The sequential, alternating, introduction of chemicals is commonly called pulsing or dosing (of chemicals). In between each chemical pulse there is commonly a purging period during which a flow of gas which does not react with the chemicals used in the process is introduced through the reaction space. This gas, often called the carrier gas or purge gas, is therefore inert towards the chemicals used in the process and purges the reaction space from e.g. surplus chemical and by-products resulting from reactions between the surface and the previous chemical pulse. This purging can be arranged also by other means, and the deposition method can be called by other names such as ALE (Atomic Layer Epitaxy), ALCVD (Atomic Layer Chemical Vapor Deposition), cyclic vapour deposition etc. The essential feature of these methods is to sequentially expose the deposition surface to precursors and to growth reactions of precursors essentially on the deposition surface. A film can be grown by an ALD process by repeating several times a pulsing sequence comprising the aforementioned pulses containing the precursor material, and the purging periods. The number of how many times this sequence, called the "ALD cycle", is repeated depends on the targeted thickness of the film, or coating.

Many different apparatuses suitable for carrying out an ALD- or an ALD-like process are disclosed in the prior art. For example U.S. Pat. No. 6,824,816 discloses processes for depositing noble metal thin-films by ALD, and U.S. Pat. Nos. 6,174,377 and 4,389,973 describe deposition tools for ALD. A good review about the basics of ALD in general is the book; Atomic Layer Epitaxy, by T. Suntola et al., Blackie and Son Ltd., Glasgow, 1990.

The prior art discloses a wide range of materials that can be synthesized and deposited on a substrate by alternately exposing the surface of the substrate to different chemicals, in an ALD- or in an ALD-like process. But, dark colored light-absorbing oxide films being electrically conductive have not been demonstrated using ALD. For example, transparent conductive oxides (TCO), e.g. ZnO:Al and $In_2O_3$:Sn, have previously been deposited using ALD. However, even if these films of oxide are conductive, they are essentially transparent in the visible wavelength range.

U.S. Pat. No. 7,270,895 discloses an article having a layer coating with a dark color. Methods disclosed to form the coating in this publication are cathodic arc evaporation (CAE), sputtering, and PVD. A problem with these coating methods is their poor ability to uniformly and homogeneously coat non-planar surfaces and substrates with complex shapes. This is especially detrimental in decorative applications where the coating is intended to provide a specific appearance uniformly over the entire surface of the substrate.

Chromium oxide, $Cr_2O_3$, is a well known material that may exhibit dark grey colour tone. This material has been widely used and fabrication methods for chromium oxide are disclosed in e.g. U.S. Pat. No. 7,147,794. The methods for depositing chromium oxide are not able to produce films with uniform thickness and uniform optical properties over non-planar surfaces of e.g. three dimensional (3D) objects with complex shapes. Chromium and chromium oxide materials also have further drawbacks related to the allergenic properties of chromium.

The inventors have identified a need for oxide film material which is highly absorbing, i.e. dark colored even as relatively thin films, and that is electrically conductive, and a method that can form such material conformally with good thickness uniformity even over non-planar surfaces of 3D objects of various shapes.

PURPOSE OF THE INVENTION

A purpose of the present invention is to solve the aforementioned technical problems of the prior-art by providing a new type of method for fabricating an electrically conductive oxide film on a surface of a substrate, and a new type of electrically conductive oxide film, and uses for the same.

SUMMARY OF THE INVENTION

The method according to the present invention is characterized by what is presented in claim 1.

The product according to the present invention is characterized by what is presented in claim 19.

The use according to the present invention is characterized by what is presented in claim 26 or 27.

A method according to the present invention for forming an electrically conductive oxide film on a substrate comprises the steps of, bringing the substrate into a reaction space, forming a preliminary deposit on a deposition surface of the substrate and treating the deposition surface with a chemical. The step of forming the preliminary deposit on the deposition surface of the substrate comprises forming a preliminary deposit of transition metal oxide on the deposition surface and subsequently purging the reaction space, and the step of treating the deposition surface with a chemical comprises treating the deposition surface with an organometallic chemical comprising first metal such that at least a portion of the organometallic chemical reacts with at least part of the preliminary deposit and subsequently purging the reaction space, to form oxide comprising oxygen, first metal and transition metal; the steps of forming the preliminary deposit and treating the deposition surface being alternately repeated such that a film of electrically conductive oxide is formed on the substrate.

An electrically conductive oxide film according to the present invention comprises oxygen, first metal and transition metal. The film is formed by forming a preliminary deposit of transition metal oxide on the deposition surface of the substrate and subsequently purging the reaction space, and treating the deposition surface with an organometallic chemical comprising first metal such that at least a portion of the organometallic chemical reacts with at least part of the preliminary deposit and subsequently purging the reaction space, to form oxide comprising oxygen, first metal and transition metal. The steps of forming the preliminary deposit and treating the deposition surface are alternately repeated such that a film of electrically conductive oxide is formed on the substrate.

It is emphasized that the expression "electrically conductive" should be understood in this specification as referring to the property of the film being electrically non-insulating. I.e. the expression "electrically conductive" should, unless otherwise stated, be understood in this specification as including semiconducting and conducting films.

It is emphasized that the expression "deposit" should be understood in this specification as referring to a very small amount of material, e.g. to a layer with a thickness of below a few monolayers, in which, atoms may not be organized to a specific phase such that the advantages of the invention could be achieved. It was observed that only when the steps of forming the preliminary deposit and treating the deposition surface with an organometallic chemical are alternately repeated such that a film of electrically conductive oxide is formed on the substrate can this film of material possess the advantageous properties. Hence the expression "film" should be understood as a structure in which the volume of material is sufficient to enable atoms in the film to organize in a phase which possesses the surprising advantages.

It is obvious, but nevertheless also emphasized, that the steps of "forming a preliminary deposit" and "treating the deposition surface" do not have to be performed successively but a method according to the present invention may include other steps in between forming the preliminary deposit and treating the deposition surface. The other steps in between "forming a preliminary deposit" and "treating the deposition surface" may include e.g. growing deposit of other material on the deposition surface such that reaction of the preliminary deposit with the organometallic chemical is not entirely prevented.

The steps of forming the preliminary deposit and treating the deposition surface are performed alternately, i.e. these steps do not markedly overlap in time. This means that the chemicals responsible for the growth of the preliminary deposit are not present in large amounts in the same space at the same time with the chemicals responsible for treating the deposition surface, i.e. the organometallic chemical. Hence the formation process of the preliminary deposit does not markedly affect the treatment process of the deposition surface, and vice versa. It will however be obvious for a skilled person in light of this specification that in case the aforementioned two steps are performed in e.g. the same reaction space, residuals of chemicals from the previous step may be present a long time in the reaction space. These residuals may be able to affect the following process steps to some extent even though the steps do not markedly overlap in time. In this context alternation of the two steps is intended to ensure that chemical reactions governing the formation of the film of oxide predominantly occur on or close to the deposition surface and not in the gas phase farther away from the deposition surface. Unless otherwise stated, this definition also holds for other process steps discussed in this specification which are intended to be alternately performed.

In one embodiment of the present invention, forming the preliminary deposit of transition metal oxide comprises in any order the alternating steps of, a) exposing the deposition surface of the substrate to an oxygen-containing chemical such that at least a portion of the oxygen containing chemical gets adsorbed onto the deposition surface, and subsequently purging the reaction space, and b) exposing the deposition surface of the substrate to a transition metal chemical such that at least a portion of the transition metal chemical gets adsorbed onto the deposition surface, and subsequently purging the reaction space.

In one embodiment of the present invention, treating the deposition surface with an organometallic chemical comprises c) exposing the deposition surface of the substrate to an organometallic chemical such that at least a portion of the organometallic chemical gets adsorbed onto the deposition surface, and subsequently purging the reaction space.

According to one embodiment of the present invention the method of the present invention is used to fabricate an electrically conductive oxide film on a substrate, for absorbing light. According to another embodiment of the present invention the method of the present invention is used to fabricate an electrically conductive oxide film on a substrate for attenuating the propagation of electromagnetic wave in the film in the visible wavelength range.

According to one embodiment of the present invention the electrically conductive oxide film of the present invention is used as a film on a substrate, for absorbing light. According to another embodiment of the present invention the electrically conductive oxide film of the present invention is used as an electrically conductive film on a substrate for attenuating the propagation of electromagnetic wave in the film in the visible wavelength range.

The expression "visible wavelength range" should, unless otherwise stated, be understood in this specification as the wavelength band, which is visible for a human, i.e. the wavelength band of 400-750 nm of the electromagnetic spectrum.

According to one embodiment of the present invention the method comprises forming an electrically conductive, light absorbing oxide film. According to one embodiment of the present invention the method comprises forming a lossy film. The method of the present invention results in a film with very conformal coverage even over complex non-planar surfaces of 3D objects. Among other benefits, this facilitates e.g. the optical design of coatings employing this film. The material of the film exhibits good chemical stability when exposed to e.g. atmospheric conditions or to other potentially oxidizing conditions in which the film may be exposed to moisture and/or oxygen. The method of the present invention enables the fabrication of an electrically conductive oxide film. The fabrication method for the film furthermore enables accurate control of the electrical conductivity of the film. The material of the film surprisingly also exhibits a high absorption coefficient and, for some embodiments of the present invention, relatively uniform absorption spectra in the visible part of the electromagnetic spectrum.

Without limiting the invention to any specific theory about why the method of the present invention results in the aforementioned advantages, the following theory should be considered. When the preliminary deposit of transition metal oxide reacts with the organometallic chemical, the first metal of the organometallic chemical gets incorporated as part of the deposit such that optically absorbing and electrically conductive oxide is formed. The chemical reactions resulting in the formation of the optically absorbing and electrically conductive phase of the oxide comprising oxygen, transition metal and the first metal are not entirely known at this point, but experimental results revealed that these reactions surprisingly provide oxide which has a high absorption coefficient for visible light. Further, the oxide formed is electrically conductive.

An electrically conductive film of this oxide can be formed by alternately repeating the steps of forming the preliminary deposit and treating the formed deposit. This electrically conductive oxide film possesses the advantageous properties discussed above. Furthermore, the alternate growth of the preliminary deposit and the treating of this deposit leads to an at least partly self-limiting growth mechanism which results in the advantageous conformality of the electrically conductive oxide film with a relatively uniform thickness profile.

There exists many different sequences for performing the steps a), b) and c) of some embodiments of the present invention in a particular order, and some embodiments of the invention having a specific order for performing the steps a), b) and c) provide somewhat better results than other embodiments. In some other embodiments of the invention the steps a) and b) can be repeated a number of times to form the preliminary deposit before, in the step c), this preliminary deposit is exposed to the organometallic chemical. The invention does not limit the number of repetitions for the steps a) and b) before the step c).

In one embodiment of the invention the steps a), b), and c) are carried out in the order, first a), then b), then c), then b) again, and this sequence is repeated one or more times to increase the thickness of the film. In another embodiment of the invention the steps a), b), and c) are carried out in the order, first a), then b), then c), and this sequence is repeated one or more times to increase the thickness of the film.

In one embodiment of the invention the steps a), b), and c) are carried out in the order, first a) and then b), this sequence is repeated one or more times, after which step c) is carried out.

As each exposure of the surface of the substrate to a chemical results in a portion of the chemical being adsorbed onto the surface of the substrate, the number of how many times the surface of the substrate is exposed to the chemicals can be utilized in some embodiments of the invention to control the thickness of the film. These methods of forming a film on a substrate therefore enable very accurately controlling the thickness of the film. Hence, the total absorption of light in the film, and therefore the darkness of the film, can be accurately controlled. When the chemicals responsible for film growth are alternately present in the reaction space the chemicals are not able to significantly intermix and the growth of the highly absorbing film is predominantly governed by adsorption reactions on the deposition surface. The kinetics of these adsorption reactions are, on the other hand, governed predominantly by the properties of the deposition surface and not so much by the flow dynamics of the chemicals over the deposition surface and in the reaction space. In some embodiments of the invention this results in the highly absorbing film being very conformal and having a very uniform thickness essentially regardless of the shape of the substrate (or of the deposition surface).

In one embodiment of the invention the steps a), b), and c) are each carried out one or more times for forming a film having a thickness between 1 nm to 2 µm on the substrate. When the thickness of the film is below 1 nm or above 2 µm the film is essentially transparent or opaque, respectively, to human eye. Therefore films falling within the range of 1 nm to 2 µm can be efficiently used as greyscale filters.

In one embodiment of the invention the pressure in the reaction space is between 0.1 mbar (0.1 hPa) and 100 mbar (100 hPa) when the surface of the substrate is exposed to chemicals. In another embodiment of the invention the temperature of the surface of the substrate is in the range of 150° C. to 600° C., preferably in the range of 200° C. to 500° C. and most preferably in the range of 250 to 450° C., when the surface of the substrate is exposed to chemicals.

In one embodiment of the invention the transition metal chemical is a transition metal halide. In another embodiment of the invention the transition metal halide is a transition metal chloride. In yet another embodiment of the invention the transition metal chloride is selected from the group of titanium trichloride, titanium tetrachloride, zirconium tetrachloride, hafnium tetrachloride, niobium pentachloride, tantalum pentachloride, molybdenum pentachloride, and tungsten hexachloride.

In another embodiment of the invention the transition metal chemical is ethoxide comprising transition metal.

In one embodiment of the invention the metal portion of the organometallic chemical is selected from the group consisting of aluminum, gallium, and transition metals. In another embodiment of the invention the organic portion of the organometallic chemical comprises an alkyl ligand. In yet another embodiment of the invention the organometallic chemical is trimethylaluminum.

In one embodiment of the invention the oxygen containing chemical also contains hydrogen. In another embodiment of the invention the oxygen containing chemical is water. Other examples of the oxygen containing chemical are ozone, oxygen radicals, oxygen, ethoxides, $H_2O_2$ and $N_2O$.

By suitably choosing the chemicals and the process parameters, especially the temperature of the substrate when the surface of the substrate is exposed to chemicals and the pressure inside the reaction space, the adsorption of chemicals onto the deposition surface, the growth of the preliminary deposit of transition metal oxide and the treatment of this preliminary deposit with the organometallic chemical, can be made essentially self-limiting. This further improves the thickness uniformity of the resulting film and conformality on the surface of 3D objects with complex shapes. Additionally many of the chemicals listed above are inexpensive and the method of the invention can be carried out cost-effectively.

In one embodiment of the invention the substrate is non-planar.

In one embodiment of the invention the film comprises oxygen suitably in the range of 40 to 80 atomic percent, preferably in the range of 55 to 75 atomic percent, and most preferably in the range of 60 to 70 atomic percent. In another embodiment of the invention the film comprises first metal suitably in the range of 5 to 40 atomic percent, preferably in the range of 7 to 30 atomic percent, and most preferably in the range of 10 to 25 atomic percent. In yet another embodiment of the invention the film comprises transition metal suitably in the range of 6 to 30 atomic percent, preferably in the range of 10 to 25 atomic percent, and most preferably in the range of 13 to 23 atomic percent. In one embodiment of the invention the film comprises oxygen, transition metal and first metal such that the ratio of the atomic percentage of oxygen to the sum of the atomic percentage of the transition metal and the atomic percentage of the first metal is in the range of 1.8 to 2.1. The advantages of the present invention are further emphasized in the composition ranges disclosed hereinbefore.

In one embodiment of the invention the first metal is aluminum. In another embodiment of the invention the transition metal is titanium.

In one embodiment of the invention the oxygen containing chemical is water, the transition metal chemical is titanium tetrachloride and the organometallic chemical is trimethylaluminum.

In one embodiment of the invention the substrate is essentially transparent in the visible part of the electromagnetic spectrum. In another embodiment of the invention the substrate is a lens. On a lens, in e.g. eyeglasses, a film of the present invention can be used to impart a special color appearance to the lens on one side while attenuating this color appearance on the other side to retain a natural viewing experience.

The embodiments of the invention described hereinbefore may be used in any combination with each other. Several of the embodiments may be combined together to form a further embodiment of the invention. A method, a product, or a use, to which the invention is related, may comprise at least one of the embodiments of the invention described hereinbefore.

DETAILED DESCRIPTION OF THE INVENTION

Figure 2:
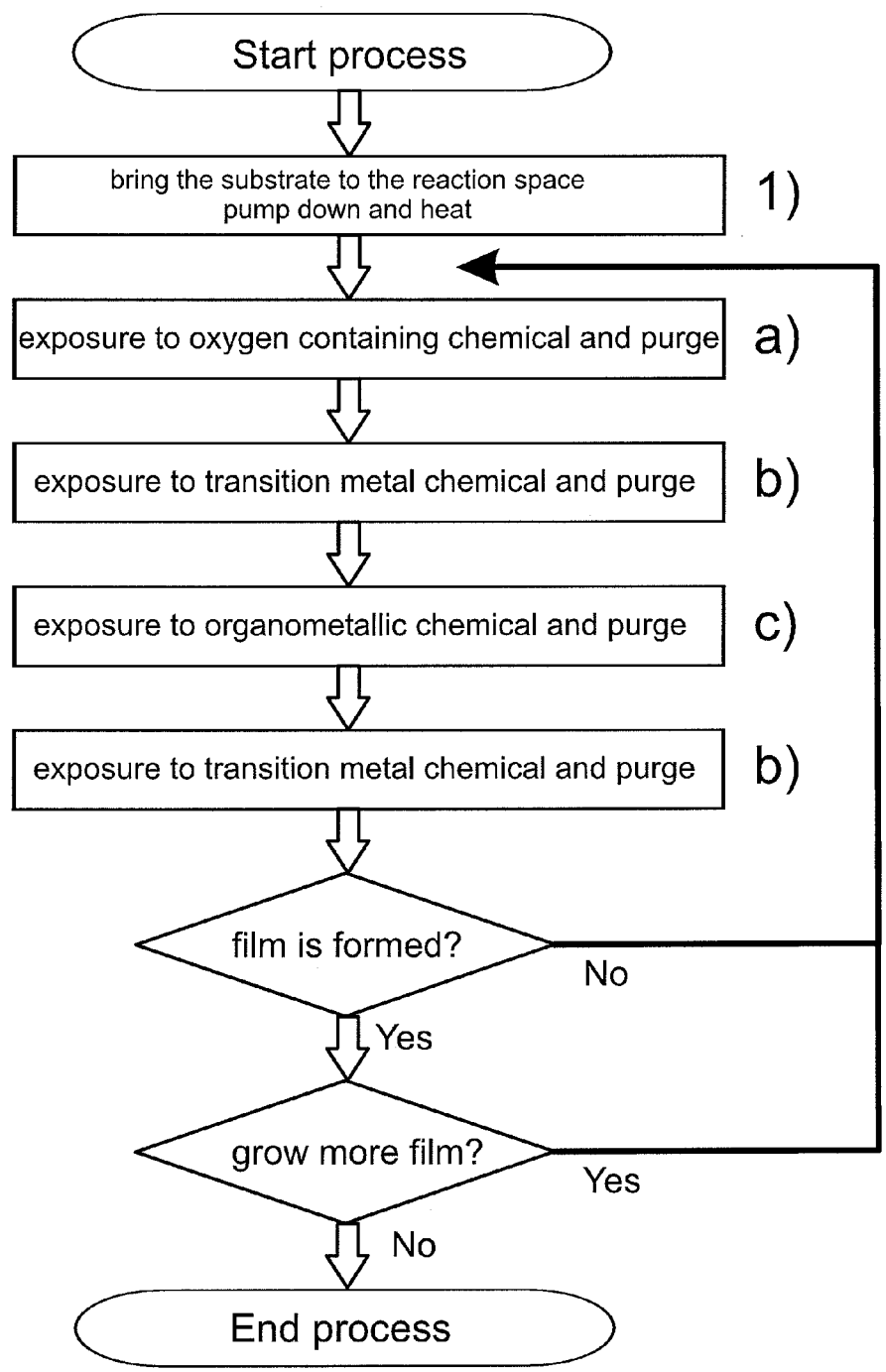
Figure 3:
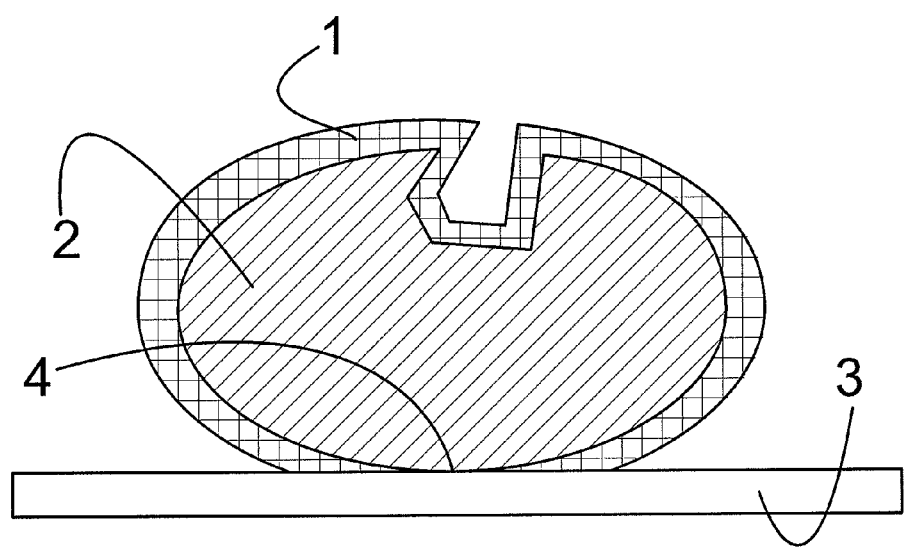
Figure 4:
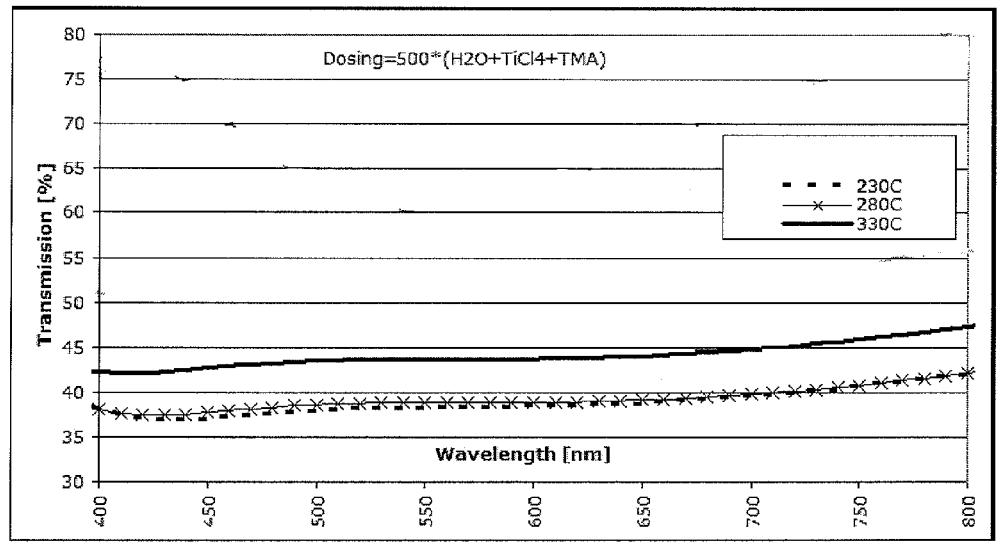
Figure 5:
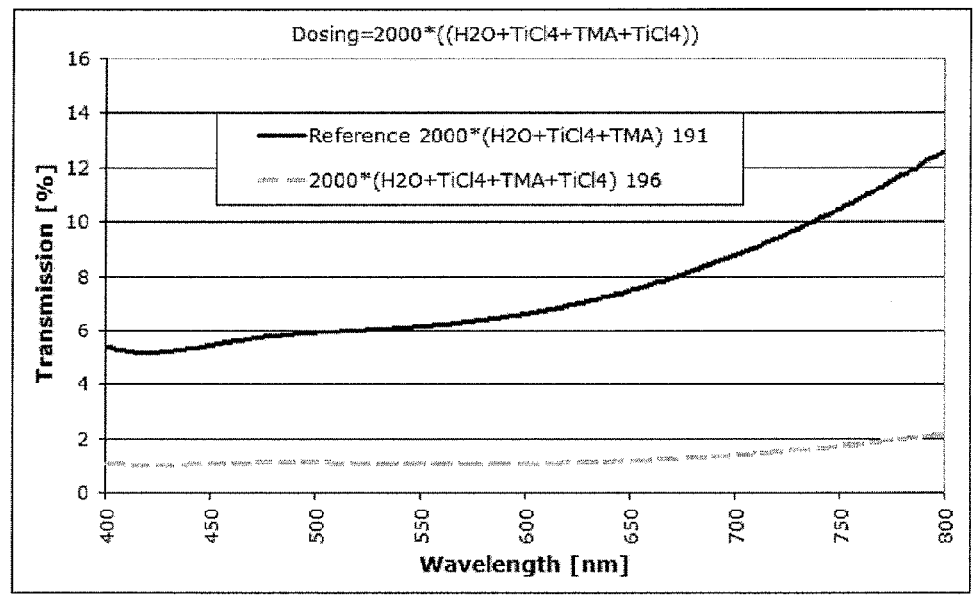
Figure 6:
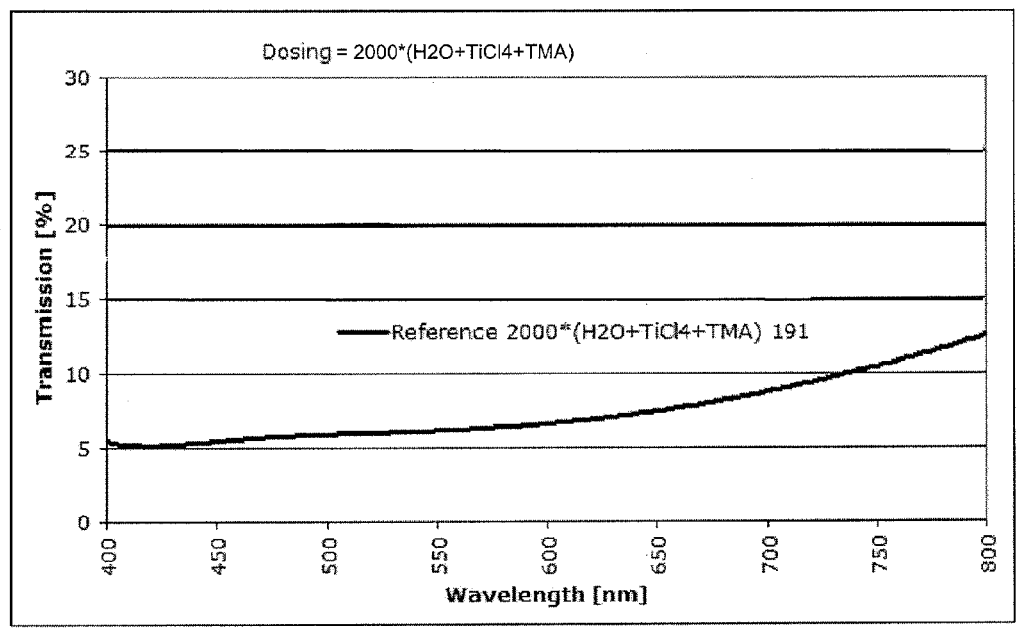
Figure 7:
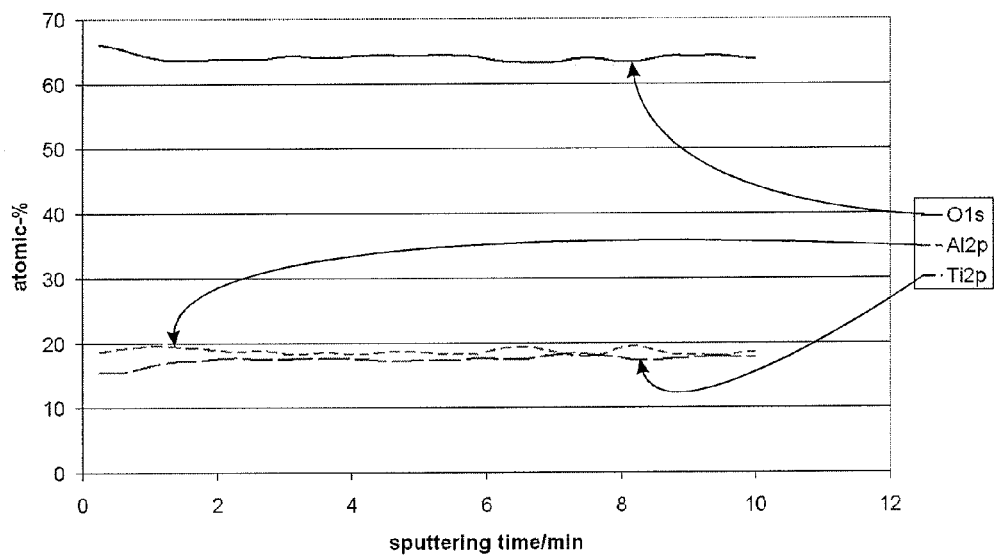

In the following, the present invention will be described in more detail with exemplary embodiments by referring to the accompanying figures, in which FIG. 1 is a flow-chart illustration of a method according to a first embodiment of the present invention, FIG. 2 is a flow-chart illustration of a method according to a second embodiment of the present invention, FIG. 3 schematically illustrates how the film formed according to one embodiment of the present invention conforms to the shape of the substrate, FIG. 4 presents data obtained from optical transmission measurements from a film formed according to the first embodiment of the present invention, FIG. 5 presents data obtained from optical transmission measurements from a film formed according to the second embodiment of the present invention, FIG. 6 presents data obtained from optical transmission measurements from a film formed according to the first embodiment of the present invention, and FIG. 7 presents an SEM-EDS composition analysis of a film formed according to one embodiment of the invention.

The description below discloses some embodiments of the invention in such a detail that a person skilled in the art is able to utilize the invention based on the disclosure. Not all steps of the embodiments are discussed in detail, as many of the steps will be obvious for the person skilled in the art based on this specification.

For example, the construction of a processing tool suitable for carrying out the methods in the following embodiments will be obvious for the skilled person in light of this specification. The tool can be e.g. a conventional ALD tool suitable for handling the chemicals discussed below. ALD tools (i.e. reactors) are disclosed in e.g. U.S. Pat. No. 4,389,973 and U.S. Pat. No. 4,413,022 which are included herein as references. Many of the steps related to handling such tools, such as delivering a substrate into the reaction space, pumping the reaction space down to a low pressure or adjusting gas flows in the tool if the process is done at atmospheric pressure, heating the substrates and the reaction space etc., will be obvious for the skilled person in light of this specification. Also, many other known operations or features are not described in detail nor mentioned, in order to emphasize relevant aspects of the various embodiments of the invention.

In this specification, unless otherwise stated, the term "surface of the substrate", "the surface" or "deposition surface" is used to address the surface of the substrate or the surface of the already formed film on the substrate. Hence the deposition surface changes during the method of forming a film on the substrate when chemicals get adsorbed onto the surface.

The exemplary embodiments of the present invention below begin by bringing the substrate into the reaction space (step 1)) of a typical reactor tool, e.g. a tool suitable for carrying out an ALD process. The reaction space is subsequently pumped down to a pressure suitable for forming the film using e.g. a mechanical vacuum pump, or in the case of atmospheric pressure ALD systems and/or processes, flows are typically set to protect the deposition zone from the atmosphere. The substrate is also heated to a temperature suitable for forming the film by the used method. The substrate can be introduced to the reaction space through e.g. an airtight load-lock system or simply through a loading hatch. The substrate can be heated by e.g. resistive heating elements which also heat the entire reaction space. Step 1) may also include other preparation procedures, such as growing film on the substrate or otherwise preparing the substrate for subsequent process steps. The preparation procedures can depend on the reactor tool or on the environment in which the tool is operated. The implementation of these procedures will be obvious for the skilled person in light of this specification.

After the substrate and the reaction space have reached the targeted temperature and other conditions suitable for deposition an alternate exposure of the deposition surface to different chemicals is started, to form preliminary deposit of transition metal oxide. The preliminary deposit can in some other embodiments of the invention be formed by methods such as CVD or PVD which do not employ alternating exposure of the deposition surface to different chemicals.

The surface of the substrate is suitably exposed to chemicals in their gaseous form. This can be realized by first evaporating the chemicals in their respective source containers which may or may not be heated depending on the properties of the chemical itself. The evaporated chemical can be delivered into the reaction space by e.g. dosing it through the pipework of the reactor tool comprising flow channels for delivering the vaporized chemicals into the reaction space. Controlled dosing of vapour into the reaction space can be realized by valves installed in the flow channels. These valves are commonly called pulsing valves in a system suitable for ALD. Also other mechanisms of bringing the substrate into contact with a chemical inside the reaction space may be conceived. One alternative is to make the surface of the substrate (instead of the vaporized chemical) move inside the reaction space such that the substrate moves through a region occupied by gaseous chemical.

A typical ALD reactor also comprises a system for introducing carrier gas, such as nitrogen or argon into the reaction space such that the reaction space can be purged from surplus chemical and reaction by-products before introducing the next chemical into the reaction space. This feature together with the controlled dosing of vaporized chemicals enables alternately exposing the surface to chemicals without significant intermixing of different chemicals in the reaction space or in other parts of the ALD reactor. In practice the flow of carrier gas is commonly continuous through the reaction space throughout the deposition process and only the various chemicals are alternately introduced to the reaction space with the carrier gas. Obviously, purging of the reaction space does not necessarily result in complete elimination of surplus chemicals or reaction by-products from the reaction space but residues of these or other materials may always be present.

Following the step of various preparations (step 1) discussed above), in a first embodiment of the present invention, step a) is carried out i.e. the surface of the substrate is exposed to an oxygen containing chemical. This first embodiment is presented in FIG. 1. Exposure of the surface to the oxygen containing chemical results, in suitable process conditions discussed below, in the adsorption of a portion of the oxygen containing chemical onto the surface. After purging of the reaction space the surface is exposed to a transition metal chemical (step b)), some of which in turn gets adsorbed onto the surface resulting from step a). Step a) followed by step b) results in the formation of preliminary deposit of transition metal oxide on the deposition surface. After the purging phase of step b) the resulting surface is exposed to an organometallic chemical in step c), i.e. the preliminary deposit is treated with the organometallic chemical. This treatment results in some of the organometallic chemical getting adsorbed onto the deposition surface, and eventually the first metal in the organometallic chemical is incorporated to the deposit. The reaction space is subsequently purged. As explained, each exposure step a), b) or c) results in formation of additional deposit on the surface as a result of adsorption reactions of the corresponding chemical with the deposition surface. Thickness of the deposit on the substrate can be increased by repeating the steps a), b), and c) in this order as presented by the flow-chart of FIG. 1.

When a sufficient thickness for the deposit is reached, the deposit forms the film of oxide material comprising oxygen, first metal from the organometallic chemical and transition metal. This film of electrically conductive oxide material possesses the advantageous properties discussed. After a targeted film thickness is reached the alternate exposures are stopped and the process is ended.

Following the step of various preparations (step 1) discussed above), in a second embodiment of the present invention, step a) is carried out i.e. the surface of the substrate is exposed to an oxygen containing chemical. This second embodiment is presented in FIG. 2. Exposure of the surface to the oxygen containing chemical results, in suitable process conditions discussed below, in the adsorption of a portion of the oxygen containing chemical onto the surface. After purging of the reaction space the surface is exposed to a transition metal chemical (step b)) some of which in turn gets adsorbed onto the surface resulting from step a). Step a) followed by step b) results in the formation of preliminary deposit of transition metal oxide on the deposition surface. After the purging phase of step b) the resulting surface is exposed to an organometallic chemical in step c), i.e. the preliminary deposit is treated with the organometallic chemical. This treatment results in some of the organometallic chemical getting adsorbed onto the deposition surface, and eventually the first metal in the organometallic chemical is incorporated to the deposit. The reaction space is subsequently purged after which the resulting surface is again exposed to the transition metal chemical and the reaction space is subsequently purged, i.e. step b) is repeated. As explained, each exposure step a), b) or c) results in formation of additional deposit on the surface as a result of adsorption reactions of the corresponding chemical with the deposition surface. Thickness of the deposit on the substrate can be increased by repeating the steps a), b), c), and b) in this order as presented by the flow-chart of FIG. 2. When a sufficient thickness for the deposit is reached, the deposit forms the film of oxide material comprising oxygen, first metal from the organometallic chemical and transition metal. This film of electrically conductive oxide material possesses the advantageous properties discussed. After a targeted film thickness is reached the alternate exposures are stopped and the process is ended.

In the discussed embodiments, the shortest repeating sequence of exposure steps is called a pulsing sequence; the pulsing sequence of the first embodiment of FIG. 1 is a), b), c), and the pulsing sequence of the second embodiment of FIG. 2 is a), b), c), b). The chemical to which the substrate is exposed can be different in each exposure step of the process. In the first embodiment of FIG. 1, for example, the oxygen containing chemical in step a) can be different each time the pulsing sequence a), b), c) is repeated. This goes for other embodiments of the invention as well.

The methods disclosed above may not provide a full monolayer of deposit in one deposition cycle. After each deposition cycle, the deposition surface has open nucleation sites. A full monolayer of deposit may require even 3 to 10 deposition cycles depending on the details of the process. Scientific literature uses e.g. the term "steric hindrance" to describe the mechanism which results in this sub-monolayer coverage per one deposition cycle. There may however also be other reasons to not getting full monolayer coverage after each deposition cycle. This fact opens up the possibility to deposit, in some other embodiments of the invention, additional material on the preliminary deposit before treating the preliminary deposit with the organometallic chemical in step c), provided that the organometallic chemical of step c) can at least partly react with the material, the preliminary deposit, created by e.g. performing, possibly repeatedly, steps a) and b).

To form an electrically conductive oxide film of material possessing the advantageous properties discussed above from the deposit, the preliminary deposit may have to be alternately formed on the deposition surface and treated by the organometallic chemical several times. In the embodiments of the invention presented in FIG. 1 and FIG. 2, this is carried out by repeating the deposition cycle one or more times, i.e. by performing the cycle two or more times.

The embodiments of the present invention result in an electrically conductive oxide film 1 conforming to the shape of the substrate 2. This is schematically illustrated in FIG. 3 where the substrate 2 is placed in a reaction space such that the substrate 2 rests on a wall 3 of the reaction space. The deposited film 1 also exhibits a dark grey colour tone depending on the thickness of the deposited film 1. As illustrated by FIG. 3, the wall 3 masks part of the substrate such that the film 1 is not able to grow on the masked areas 4 of the substrate. Also other areas of a substrate 2 can be mechanically masked to deposit the film 1 on selective areas of a substrate 2.

By suitably choosing the chemicals and the process parameters utilized to deposit the film 1, the adsorption reactions responsible for film-growth exhibit self-limiting characteristics, and the conformality and the homogeneity of the film 1 can be further improved. The following examples describe in detail how the film 1 can be grown on the substrate 2.

Example 1

According to the first embodiment of the invention (see FIG. 1) electrically conductive oxide films were formed on substrates using different processing temperatures. Visibly essentially transparent D263T glass substrates with a thickness of 0.3 mm (available from Schott AG, Germany) were first inserted inside the reaction space of a P400 ALD batch tool (available from Beneq OY, Finland). The substrates were planar to enable e.g. reliable optical transmission measurements. The substrates were positioned inside the reaction space such that the bottom side of the substrate glass was masked to enable film growth only on the top side, which was exposed to the surrounding reaction space. In this example the carrier gas discussed above and responsible for purging the reaction space was nitrogen ($N_2$).

After preparations for loading the substrates into the ALD tool, the reaction space of the ALD tool was pumped down to underpressure and a continuous flow of carrier gas was set to achieve the processing pressure of about 1 mbar (1 hPa) and the substrates were subsequently heated to the processing temperature. The temperature was stabilized to the processing temperature inside the reaction space by a computer controlled heating period of four to six hours.

After the processing temperature was reached and stabilized, the method moved from step 1) to the first exposure step, step a), according to FIG. 1. The pulsing sequence of a), then b), then c) was carried out once and then repeated 499 times before the process was ended and the substrates were ejected from the reaction space and from the ALD-tool.

Exposure of the surface of the substrate to a specific chemical was carried out by switching on the pulsing valve of the P400 ALD-tool controlling the flow of the precursor chemicals into the reaction space. Purging of the reaction space was carried out by closing the valves controlling the flow of precursor chemicals into the reaction space, and thereby letting only the continuous flow of carrier gas flow through the reaction space.

The pulsing sequence in this example was in detail as follows; 0.6 s exposure to $H_2O$, 1.5 s purge, 0.4 s exposure to $TiCl_4$, 2.0 s purge, 0.5 s exposure to trimethylaluminum, 2.0 s purge. An exposure time and a purge time in this sequence signify a time a specific pulsing valve for a specific chemical was kept open and a time all the pulsing valves for chemicals were kept closed, respectively.

Since the light absorbing ability or the electromagnetic attenuating ability of the formed film is, according to elementary electromagnetic field theory, related with the film being electrically conductive, three different electrically conductive oxide films formed at different processing temperatures, at 230° C., at 280° C. and at 330° C., were evaluated by measuring optical transmission through the substrate glasses having the electrically conductive oxide film formed on one side of the substrate. The results are presented by the data of FIG. 4.

As can be inferred from FIG. 4 the electrically conductive oxide films grown at 230° C., at 280° C. and at 330° C. exhibit relatively uniform optical absorption in the visible part of 400-750 nm of the electromagnetic spectrum. The films also looked visibly dark.

Although the adsorption reactions responsible for film growth in this example are not completely understood, test runs indicated that the chemical adsorption reactions were self-limiting to at least some extent. This resulted in very conformal and uniform films over large areas of the surface and even over complex non-planar surfaces.

Measuring the thickness of this kind of oxide film is quite difficult, since receiving results using optical or ellipsometer measurements is not easy. Accurate measures could be done using TEM or HRTEM. However, these are expensive. The deposition rate of films formed at lower temperatures was about 0.11 nm/cycle. The deposition rate of the films formed at higher temperatures may be different.

However, the thicknesses of the films formed were about 55 nm. Based on performed conductivity measurements the formed films were found to be electrically conductive (see example 4).

Example 2

Electrically conductive oxide films were formed on substrates according to the second embodiment of the invention (see FIG. 2). Visibly essentially transparent D263T glass substrates with a thickness of 0.3 mm (available from Schott AG, Germany) were first inserted inside the reaction space of a P400 ALD batch tool (available from Beneq OY, Finland). The substrates were planar to enable reliable optical transmission measurements. The substrates were positioned inside the reaction space such that one side of the substrate glass was exposed (i.e. the other side of the substrate glass was masked) to the surrounding reaction space. In this example the carrier gas discussed above and responsible for purging the reaction space was nitrogen ($N_2$).

After preparations for loading the substrates into the ALD tool, the reaction space of the ALD tool was pumped down to underpressure and a continuous flow of carrier gas was set to achieve the processing pressure of about 1 mbar (1 hPa) and the substrates were subsequently heated to the processing temperature of 280° C. The temperature was stabilized to the processing temperature inside the reaction space by a computer controlled heating period of four to six hours.

After the processing temperature was reached and stabilized, the method moved from step 1) to the first exposure step, step a), according to FIG. 2. The pulsing sequence of a), then b), then c), then b) again, was carried out once and then repeated 1999 times before the process was ended and the substrates were ejected from the reaction space and from the ALD-tool.

Exposure of the surface of the substrate to a specific chemical was carried out by switching on the pulsing valve of the P400 ALD-tool controlling the flow of the chemical into the reaction space. Purging of the reaction space was carried out by closing the valves controlling the flow of precursor chemicals into the reaction space, and thereby letting only the continuous flow of carrier gas flow through the reaction space.

The pulsing sequence in this example was in detail as follows; 0.6 s exposure to $H_2O$, 1.5 s purge, 0.4 s exposure to $TiCl_4$, 2.0 s purge, 0.5 s exposure to trimethylaluminum, 2.0 s purge, 0.4 s exposure to $TiCl_4$, 2.0 s purge. An exposure time and a purge time in this sequence signify a time a specific pulsing valve for a specific chemical was kept open and a time all the pulsing valves for chemicals were kept closed, respectively.

Again the electrically conductive oxide film formed in this example was evaluated by measuring optical transmission through the substrate glasses having the film formed on both sides of the substrate (sample 196 of FIG. 5). The results are presented by the data of FIG. 5. This figure also presents a comparison to transmission data obtained from an electrically conductive oxide film formed according to the first embodiment of the invention (sample 191 of FIG. 5). This film was formed also at a processing temperature of 280° C. with the procedure identical to example 1, with the exception that the sequence a), then b), then c) was carried out once and then repeated 1999 times.

As can be inferred from FIG. 5 both electrically conductive oxide films exhibit relatively uniform optical absorption in the visible part of 400-750 nm of the electromagnetic spectrum.

Example 4

Conductivity of several oxide films formed according to different embodiments of the invention was measured using a FLUKE 8060A multimeter from a probe distance of 10 mm. The details of this measuring technique will be obvious to the skilled person. Table 1 presents the results for such measurements, where the resistance in Mohm is presented. The intention was to determine whether the film formed was insulating or conductive in nature. The actual reading depends on the film thickness.

TABLE 1

Data of the electrical conduction of oxide films formed

| Sample | Film | Processing temperature (° C.) | Film thickness (nm) | Resistance (Mohm) |
|---|---|---|---|---|
| 185 | 500 * ($H_2O$ + $TiCl_4$ + TMA) | 330 | about 55 nm | 73 |
| 186 | 500 * ($H_2O$ + $TiCl_4$ + TMA) | 280 | about 55 nm | 36 |
| 187 | 500 * ($H_2O$ + $TiCl_4$ + TMA) | 230 | about 55 nm | 100 |
| 190 | 2000 * ($H_2O$ + $TiCl_4$ + TMA) | 230 | about 220 nm | 23 |
| 191 | 2000 * ($H_2O$ + $TiCl_4$ + TMA) | 280 | about 220 nm | 10 |
| 196 | 2000 * ($H_2O$ + $TiCl_4$ + TMA + $TiCl_4$) | 280 | — | 0.59 |
| 194 | 1000 * (2 * ($H_2O$ + $TiCl_4$) + TMA) | 280 | — | 3.1 |
| 195 | 667 * (3 * ($H_2O$ + $TiCl_4$) + TMA) | 280 | — | 1.8 |

Although the adsorption reactions responsible for film growth in this example are not completely understood, test runs indicated that the chemical adsorption reactions were self-limiting to at least some extent. This resulted in very conformal films over large areas of the surface and even over complex non-planar surfaces.

Further, the thicknesses of the oxide films formed were about 220 nm (using the above assumption) for sample 191. Based on performed conductivity measurements the formed oxide films were found to be electrically conductive (see example 4).

Example 3

FIG. 6 presents transmission data obtained from an electrically conductive oxide film formed according to the first embodiment of the invention (sample 191 of FIG. 6). This electrically conductive oxide film was formed at a processing temperature of 280° C. with the procedure identical to example 1, with the exception that the sequence a), then b), then c) was carried out once and then repeated 1999 times.

As can be inferred from FIG. 6 the film exhibit relatively uniform optical absorption in the visible part of 400-750 nm of the electromagnetic spectrum.

Although the adsorption reactions responsible for film growth in this example are not completely understood, test runs indicated that the chemical adsorption reactions were self-limiting to at least some extent. This resulted in very conformal and uniform films over large areas of the surface and even over complex non-planar surfaces.

Further, the thickness of the film formed was about 220 nm (using the above assumption). Based on performed conductivity measurements the formed oxide film was found to be electrically conductive (see example 4).

As can be seen from the results presented in table 1, the oxide films formed according to the method of the present invention are electrically conductive.

Composition Results

Elemental composition of several electrically conductive oxide films formed according to different embodiments of the invention was measured using the SEM-EDS (scanning electron microscope-electron dispersive spectrometer) technique. The details of this technique will be obvious for a skilled person. FIG. 7 presents the results for one such measurement. The figure illustrates the atomic percentage of Ti (Ti2p), Al (Al2p) and oxygen (O1s) as a function of depth (which was directly proportional to the sputtering time) in an electrically conductive oxide film which was formed with the method according to example 1 above. The deposition temperature for forming the film of this measured sample was 330° C., and the pulsing sequence of a), then b), then c) was carried out once and then repeated 1999 times. The average atomic concentration of the aforementioned elements in the film, excluding the surface (at about depth 0-1 min. sputtering time), was about 65 atomic percent for oxygen, 18 atomic percent for aluminum and 17 atomic percent for titanium. This result shows that the film comprises oxygen, transition metal (titanium) and first metal (aluminum) such that the ratio of the atomic percentage of oxygen to the sum of the atomic percentage of the transition metal and the atomic percentage of the first metal is about 2 and that the film was a relatively pure oxide of aluminum and titanium.

By suitably altering the order of steps a), b) and c) in different embodiments of the method, the composition of the film could be adjusted within certain limits. Very good results, i.e. high optical absorption coefficient in the visible band, relatively uniform absorption and high conformality, were measured for electrically conductive oxide films which incorporated 60 to 70 atomic percent of oxygen, 10 to 25 atomic percent of aluminum, and 13 to 23 atomic percent of titanium, making these electrically conductive oxide films optically highly absorbing oxides.

In the examples above the oxygen containing chemical is water, preferably de-ionized $H_2O$, the transition metal chemical is $TiCl_4$, and the organometallic chemical is trimethylaluminum $Al_2(CH_3)_6$, but other chemicals can also be used. The transition metal oxide of the preliminary deposit is correspondingly titanium oxide, and the first metal is aluminum from the trimethylaluminum. The invention is not limited to using the aforementioned chemicals in particular and the advantages of the invention can be readily obtained by the skilled person in light of this specification also with the other chemicals mentioned above.

Although the examples above disclose methods which employ alternate pulsing of two different chemicals to form the preliminary deposit of transition metal oxide by the steps a) and b), this preliminary deposit can be formed by any suitable method, e.g. CVD, MOCVD or PVD. This preliminary deposit can then be subsequently treated by an organometallic chemical comprising first metal such as aluminum (like in the examples above), to form the highly absorbing oxide comprising oxygen, the first metal and the transition metal. These modifications to the disclosed embodiments will be obvious for the skilled person in light of this specification.

As is clear for a person skilled in the art, the invention is not limited to the examples and embodiments described above but the embodiments can freely vary within the scope of the claims.

The invention claimed is:

1. An electrically conductive oxide film comprising oxygen, first metal, and transition metal, wherein the film is formed by a plurality of deposition cycles, each deposition cycle including forming a preliminary deposit of a transition metal oxide on a deposition surface of a substrate in a reaction space and subsequently purging the reaction space, and treating the deposition surface with an organometallic chemical comprising a first metal such that at least a portion of the organometallic chemical reacts with at least part of the preliminary deposit and subsequently purging the reaction space, to form an oxide comprising the oxygen, the first metal, and the transition metal; the formed preliminary deposit of the transition metal oxide being less than one full monolayer in a single deposition cycle, the steps of forming the preliminary deposit and treating the deposition surface being alternately repeated such that the film of electrically conductive oxide is formed on the substrate, wherein the film comprises oxygen in the rage of 40 to 80 atomic percent, and wherein forming the preliminary deposit of transition metal oxide comprises steps of:

a) exposing the deposition surface of the substrate in the reaction space to an oxygen-containing chemical such that at least a portion of the oxygen containing chemical gets adsorbed onto the deposition surface, and subsequently purging the reaction space; and b) exposing the deposition surface of the substrate in the reaction space to a transition metal chemical such that at least a portion of the transition metal chemical gets adsorbed onto the deposition surface, and subsequently purging the reaction space;

and the treating the deposition surface with an organometallic chemical comprises c) exposing the deposition surface of the substrate in the reaction space to the organometallic chemical such that at least a portion of the organometallic chemical gets adsorbed onto the deposition surface, and subsequently purging the reaction space, and wherein the steps a), b), and c) are carried out in the order, first a), then b), then c), then b), and this sequence is repeated one or more times to increase the thickness of the film, or the steps a), b), and c) are carried out in the order, first a) and then b), this sequence is repeated one or more times, after which the step c) is carried out, and wherein the transition metal chemical is a transition metal chloride selected from the group of titanium trichloride, titanium tetrachloride, zirconium tetrachloride, hafnium tetrachloride, niobium pentachloride, tantalum pentachloride, molybdenum pentachloride, and tungsten hexachloride.

2. The electrically conductive oxide film of claim 1, wherein the film comprises the oxygen in a range of 55 to 75 atomic percent.

3. The electrically conductive oxide film of claim 1, wherein the film comprises the first metal in a range of 5 to 40 atomic percent.

4. The electrically conductive oxide film of claim 1, wherein the film comprises the transition metal in a range of 6 to 30 atomic percent.

5. The electrically conductive oxide film of claim 1, wherein the film comprises the oxygen, the transition metal, and the first metal such that the ratio of the atomic percentage of the oxygen to a sum of an atomic percentage of the transition metal and an atomic percentage of first metal is in a range of 1.8 to 2.1.

6. The electrically conductive oxide film of claim 1, wherein the first metal is aluminum.

7. The electrically conductive oxide film of claim 1, wherein the transition metal is titanium.

8. The electrically conductive oxide film of claim 1, wherein the deposition substrate is non-planar.

* * * * *